(12) United States Patent
Paseuth et al.

(10) Patent No.: US 9,879,350 B2
(45) Date of Patent: Jan. 30, 2018

(54) SURFACE-COATED CUTTING TOOL

(71) Applicant: SUMITOMO ELECTRIC HARDMETAL CORP., Itami-shi (JP)

(72) Inventors: Anongsack Paseuth, Sorachi-gun (JP); Hideaki Kanaoka, Sorachi-gun (JP); Takanori Detani, Sorachi-gun (JP); Shinya Imamura, Sorachi-gun (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 0 days.

(21) Appl. No.: 15/039,988

(22) PCT Filed: Jul. 13, 2015

(86) PCT No.: PCT/JP2015/070028
§ 371 (c)(1),
(2) Date: May 27, 2016

(87) PCT Pub. No.: WO2017/009927
PCT Pub. Date: Jan. 19, 2017

(65) Prior Publication Data
US 2017/0191168 A1    Jul. 6, 2017

(51) Int. Cl.
*B23B 27/14* (2006.01)
*C23C 28/04* (2006.01)
(Continued)

(52) U.S. Cl.
CPC .......... *C23C 28/044* (2013.01); *B23B 27/148* (2013.01); *C23C 16/36* (2013.01); *C23C 16/403* (2013.01); *C23C 28/042* (2013.01)

(58) Field of Classification Search
USPC .......... 51/307, 309; 428/336, 698, 701, 702; 407/119
See application file for complete search history.

(56) References Cited

U.S. PATENT DOCUMENTS 7,597,511 B2 * 10/2009 Tomita ................ C23C 16/0272
51/307
2006/0188747 A1    8/2006 Honma et al.
(Continued)

FOREIGN PATENT DOCUMENTS

JP        56-42412 B2    10/1981
JP        2004-122264    *  4/2004
(Continued)

OTHER PUBLICATIONS

International Search Report in PCT International Application No. PCT/JP2015/070028, dated Sep. 15, 2015.
(Continued)

*Primary Examiner* — Archene Turner
(74) *Attorney, Agent, or Firm* — Venable LLP; Michael A. Sartori; Miguel A. Lopez

(57) ABSTRACT

A surface-coated cutting tool according to the present invention includes a coating. The coating includes an $\alpha$-$Al_2O_3$ layer. Each of the $\alpha$-$Al_2O_3$ layers on a side of a rake face and a side of a flank face shows (001) orientation. In the $\alpha$-$Al_2O_3$ layer on the rake face side, a length $L_{R3}$ of a $\Sigma 3$ crystal grain boundary exceeds 80% of a length $L_{R3\text{-}29}$ of a $\Sigma 3$-29 crystal grain boundary and is not lower than 10% and not higher than 50% of a total length $L_R$ of all grain boundaries. In the $\alpha$-$Al_2O_3$ layer on the flank face side, a length $L_{F3}$ of a $\Sigma 3$ crystal grain boundary exceeds 80% of a length $L_{F3\text{-}29}$ of a $\Sigma 3$-29 crystal grain boundary and is not lower than 10% and not higher than 50% of a total length $L_F$ of all grain boundaries. A ratio $L_{R3}/L_{R3\text{-}29}$ is higher than a ratio $L_{F3}/L_{F3\text{-}29}$.

7 Claims, 3 Drawing Sheets

(51) Int. Cl.
*C23C 16/36* (2006.01)
*C23C 16/40* (2006.01)

(56) References Cited

U.S. PATENT DOCUMENTS

| | | | |
|---|---|---|---|
| 2007/0116985 A1* | 5/2007 | Osada | C23C 16/403 428/698 |
| 2009/0269150 A1* | 10/2009 | Omori | B23B 27/141 407/114 |
| 2010/0260561 A1 | 10/2010 | Moriguchi et al. | |
| 2012/0003452 A1 | 1/2012 | Tomita et al. | |
| 2014/0193622 A1 | 7/2014 | Stiens et al. | |

FOREIGN PATENT DOCUMENTS

| | | | |
|---|---|---|---|
| JP | 2006-198735 A | | 8/2006 |
| JP | 2006-326713 A | | 12/2006 |
| JP | 2011-200953 | * | 10/2011 |
| JP | 2011-200953 A | | 10/2011 |
| JP | 2014-018886 A | | 2/2014 |
| JP | 2014-526391 A | | 10/2014 |
| WO | WO-2010/106811 A1 | | 9/2010 |
| WO | WO-2014/132995 A1 | | 9/2014 |

OTHER PUBLICATIONS

International Search Report in PCT International Application No. PCT/JP2015/070029, dated Sep. 15, 2015.
International Search Report in PCT International Application No. PCT/JP2015/070030, dated Sep. 15, 2015.
Notice of Grounds of Rejection in Japanese Patent Application No. 2015-548531, dated Nov. 10, 2015.
Decision to Grant Patent in Japanese Patent Application No. 2015-548531, dated Dec. 15, 2015.
U.S. Appl. No. 15/039,999, filed May 27, 2016 [Related application, provided in IFW].
U.S. Appl. No. 15/100,008, filed May 27, 2016 [Related application, provided in IFW].
Office Action in U.S. Appl. No. 15/039,999, dated May 1, 2017 [Related application, provided in IFW].
Office Action in U.S. Appl. No. 15/100,008, dated May 11, 2017 [Related application, provided in IFW].
Notice of Allowance issued in U.S. Appl. No. 15/039,999, dated Sep. 25, 2017.
Corrected Notice of Allowance issued in U.S. Appl. No. 15/039,999, dated Oct. 4, 2017.
Notice of Allowance issued in U.S. Appl. No. 15/100,008, dated Sep. 26, 2017.

* cited by examiner

SURFACE-COATED CUTTING TOOL

TECHNICAL FIELD

The present invention relates to a surface-coated cutting tool.

BACKGROUND ART

A surface-coated cutting tool having a coating formed on a base material has conventionally been used. For example, Japanese Patent Laying-Open No. 2006-198735 (PTD 1) discloses a surface-coated cutting tool having a coating including an $\alpha$-$Al_2O_3$ layer in which a ratio of a $\Sigma 3$ crystal grain boundary in a $\Sigma 3$-29 crystal grain boundary is 60 to 80%.

Japanese National Patent Publication No. 2014-526391 (PTD 2) discloses a surface-coated cutting tool having a coating including an $\alpha$-$Al_2O_3$ layer in which a length of a $\Sigma 3$ crystal grain boundary exceeds 80% of a length of a $\Sigma 3$-29 crystal grain boundary.

CITATION LIST

Patent Document

PTD 1: Japanese Patent Laying-Open No. 2006-198735
PTD 2: Japanese National Patent Publication No. 2014-526391

SUMMARY OF INVENTION

Technical Problem

As a ratio of a $\Sigma 3$ crystal grain boundary in grain boundaries included in an $\alpha$-$Al_2O_3$ layer is higher in a coating including the $\alpha$-$Al_2O_3$ layer composed of polycrystalline $\alpha$-$Al_2O_3$, various characteristics represented by mechanical characteristics improve and hence resistance to wear and resistance to breakage are improved. It is thus expected that a cutting tool is longer in life.

In recent working by cutting, however, a speed and efficiency have become high, load imposed on a cutting tool has increased, and life of the cutting tool has disadvantageously become short. Therefore, further improvement in mechanical characteristics of a coating on the cutting tool and longer life of the cutting tool have been demanded.

The present disclosure was made in view of such circumstances, and an object thereof is to provide a surface-coated cutting tool achieving improved mechanical characteristics of a coating and longer life of the cutting tool.

Solution to Problem

A surface-coated cutting tool according to one embodiment of the present disclosure has a rake face and a flank face, and includes a base material and a coating formed on the base material. The coating includes an $\alpha$-$Al_2O_3$ layer, the $\alpha$-$Al_2O_3$ layer contains a plurality of crystal grains of $\alpha$-$Al_2O_3$, and a grain boundary of the crystal grains includes a CSL grain boundary and a general grain boundary. The $\alpha$-$Al_2O_3$ layer on a rake face side shows (001) orientation, and in the $\alpha$-$Al_2O_3$ layer on the rake face side, a length $L_{R3}$ of a $\Sigma 3$ crystal grain boundary in the CSL grain boundary exceeds 80% of a length $L_{R3-29}$ of a $\Sigma 3$-29 crystal grain boundary and is not lower than 10% and not higher than 50% of a total length $L_R$ of all grain boundaries which is a sum of length $L_{R3-29}$ and a length $L_{RG}$ of the general grain boundary. The $\alpha$-$Al_2O_3$ layer on a flank face side shows (001) orientation, and in the $\alpha$-$Al_2O_3$ layer on the flank face side, a length $L_{F3}$ of a $\Sigma 3$ crystal grain boundary in the CSL grain boundary exceeds 80% of a length $L_{F3-29}$ of a $\Sigma 3$-29 crystal grain boundary and is not lower than 10% and not higher than 50% of a total length $L_F$ of all grain boundaries which is a sum of length $L_{F3-29}$ and a length $L_{FG}$ of the general grain boundary. A ratio $L_{R3}/L_{R3-29}$ of length $L_{R3}$ to length $L_{R3-29}$ is higher than a ratio $L_{F3}/L_{F3-29}$ of length $L_{F3}$ to length $L_{F3-29}$.

Advantageous Effects of Invention

According to the above, mechanical characteristics of a coating can be improved and life of a cutting tool can further be longer.

DESCRIPTION OF EMBODIMENTS

[Description of Embodiments of Present Invention]

Figure 1:
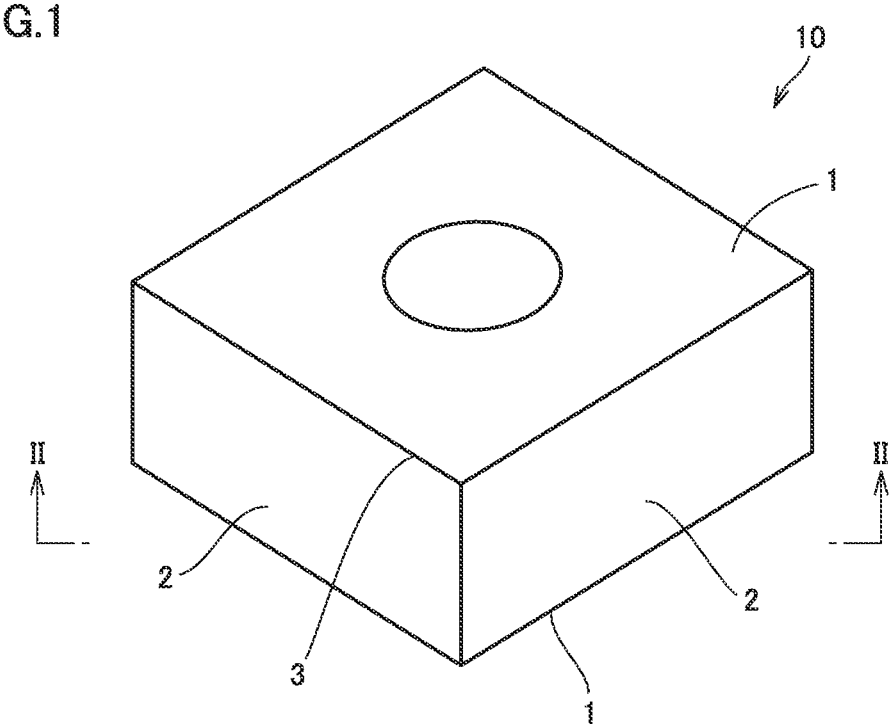
FIG. 1 is a perspective view of a surface-coated cutting tool according to one embodiment of the present disclosure.

Embodiments of the present disclosure will initially be listed and described.

[1] A surface-coated cutting tool according to one embodiment of the present disclosure has a rake face and a flank face, and includes a base material and a coating formed on the base material. The coating includes an $\alpha$-$Al_2O_3$ layer, the $\alpha$-$Al_2O_3$ layer contains a plurality of crystal grains of $\alpha$-$Al_2O_3$, and a grain boundary of the crystal grains includes a CSL grain boundary and a general grain boundary. The $\alpha$-$Al_2O_3$ layer on a rake face side shows (001) orientation, and in the $\alpha$-$Al_2O_3$ layer on the rake face side, a length $L_{R3}$ of a $\Sigma 3$ crystal grain boundary in the CSL grain boundary exceeds 80% of a length $L_{R3-29}$ of a $\Sigma 3$-29 crystal grain boundary and is not lower than 10% and not higher than 50% of a total length $L_R$ of all grain boundaries which is a sum of length $L_{R3-29}$ and a length $L_{RG}$ of the general grain boundary. The $\alpha$-$Al_2O_3$ layer on a flank face side shows (001) orientation, and in the $\alpha$-$Al_2O_3$ layer on the flank face side, a length $L_{F3}$ of a $\Sigma 3$ crystal grain boundary in the CSL grain boundary exceeds 80% of a length $L_{F3-29}$ of a $\Sigma 3$-29 crystal grain boundary and is not lower than 10% and not higher than 50% of a total length $L_F$ of all grain boundaries which is a sum of length $L_{F3-29}$ and a length $L_{FG}$ of the general grain boundary. A ratio $L_{R3}/L_{R3-29}$ of length $L_{R3}$ to length $L_{R3-29}$ is higher than a ratio $L_{F3}/L_{F3-29}$ of length $L_{F3}$ to length $L_{F3-29}$. This surface-coated cutting tool achieves improved mechanical characteristics of a coating and longer life.

[2] In the surface-coated cutting tool, the CSL grain boundary is constituted of the $\Sigma 3$ crystal grain boundary, a $\Sigma 7$ crystal grain boundary, a $\Sigma 11$ crystal grain boundary, a $\Sigma 17$ crystal grain boundary, a $\Sigma 19$ crystal grain boundary, a $\Sigma 21$ crystal grain boundary, a $\Sigma 23$ crystal grain boundary, and a $\Sigma 29$ crystal grain boundary, length $L_{R3-29}$ is a total sum of lengths of the $\Sigma 3$ crystal grain boundary, the $\Sigma 7$ crystal grain boundary, the $\Sigma 11$ crystal grain boundary, the $\Sigma 17$ crystal grain boundary, the Σ19 crystal grain boundary, the Σ21 crystal grain boundary, the Σ23 crystal grain boundary, and the Σ29 crystal grain boundary in the α-Al$_2$O$_3$ layer on the rake face side, and length L$_{F3-29}$ is a total sum of lengths of the Σ3 crystal grain boundary, the Σ7 crystal grain boundary, the Σ11 crystal grain boundary, the Σ17 crystal grain boundary, the Σ19 crystal grain boundary, the Σ21 crystal grain boundary, the Σ23 crystal grain boundary, and the Σ29 crystal grain boundary in the α-Al$_2$O$_3$ layer on the flank face side.

[3] Preferably, the α-Al$_2$O$_3$ layer has a thickness from 2 to 20 μm. The characteristics above are thus most effectively exhibited.

[4] Preferably, the α-Al$_2$O$_3$ layer has surface roughness Ra less than 0.2 μm. Thus, adhesive wear between a work material and a cutting edge of the tool is suppressed and consequently resistance to chipping of the cutting edge is improved.

[5] Preferably, the α-Al$_2$O$_3$ layer includes a point where an absolute value for compressive stress is maximal, in a region within 2 μm from a surface side of the coating, and the absolute value for compressive stress at the point is lower than 1 GPa. Thus, breakage of the cutting edge of the tool due to mechanical and thermal fatigue which occurs during an intermittent cutting process is suppressed and consequently reliability of the cutting edge is improved.

[6] Preferably, the coating includes a TiC$_x$N$_y$ layer between the base material and the α-Al$_2$O$_3$ layer, and the TiC$_x$N$_y$ layer contains TiC$_x$N$_y$ satisfying atomic ratio relation of 0.6≤x/(x+y)≤0.8. Adhesion between the base material and the α-Al$_2$O$_3$ layer is thus improved.

[Details of Embodiments of Present Invention]

A surface-coated cutting tool according to an embodiment of the present invention (hereinafter also denoted as the "present embodiment") will be described in further detail below with reference to FIGS. 1 to 3.

<Surface-Coated Cutting Tool>

Referring to FIG. 1, a surface-coated cutting tool 10 according to the present embodiment (hereinafter simply denoted as a "tool 10") has a rake face 1, a flank face 2, and a cutting edge ridgeline portion 3 at which rake face 1 and flank face 2 intersect with each other. Namely, rake face 1 and flank face 2 are surfaces connected to each other with cutting edge ridgeline portion 3 being interposed. Cutting edge ridgeline portion 3 implements a cutting edge tip end portion of tool 10. Such a shape of tool 10 relies on a shape of a base material which will be described later.

Though FIG. 1 shows tool 10 representing a throwaway chip for turning, tool 10 is not limited thereto and the tool can suitably be used as a cutting tool such as a drill, an end mill, a throwaway tip for a drill, a throwaway tip for an end mill, a throwaway tip for milling, a metal saw, a gear cutting tool, a reamer, and a tap.

When tool 10 is implemented as a throwaway chip, tool 10 may or may not have a chip breaker, and cutting edge ridgeline portion 3 may have a sharp edge (a ridge at which a rake face and a flank face intersect with each other) (see FIG. 1), may be honed (a sharp edge provided with R) (see FIG. 3), may have a negative land (beveled), and may be honed and have a negative land.

Figure 2:
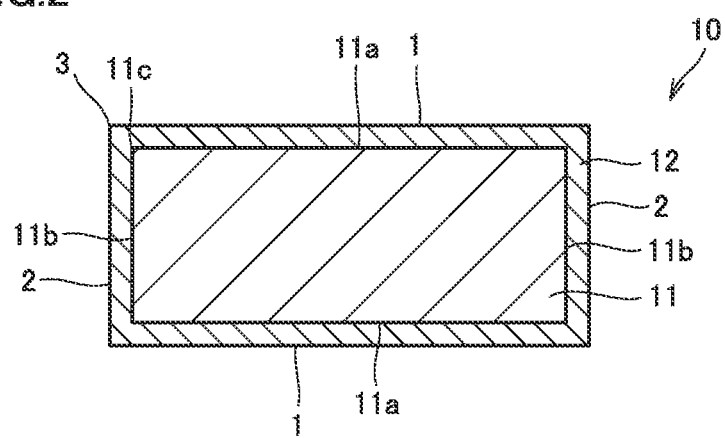
FIG. 2 is a cross-sectional view along the line II-II in FIG. 1.
Figure 3:
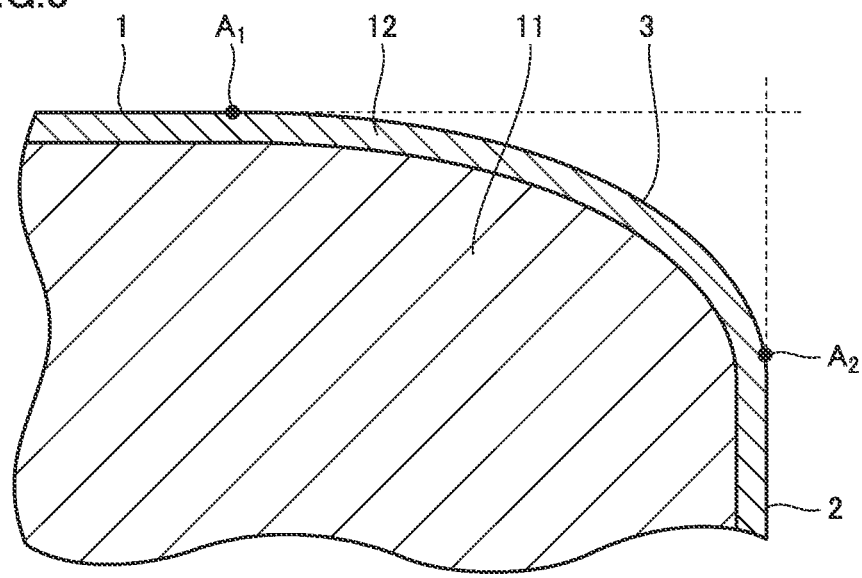
FIG. 3 is a cross-sectional view illustrating a surface-coated cutting tool having a honed cutting edge ridgeline portion.

Referring to FIG. 2, tool 10 has a base material 11 and a coating 12 formed on base material 11. Though coating 12 preferably covers the entire surface of base material 11 in tool 10, a part of base material 11 being not covered with coating 12 or a partially different construction of coating 12 does not depart from the scope of the present embodiment.

<Base Material>

Base material 11 according to the present embodiment has a rake face 11a, a flank face 11b, and a cutting edge ridgeline portion 11c at which rake face 11a and flank face 11b intersect with each other. Rake face 11a, flank face 11b, and cutting edge ridgeline portion 11c implement rake face 1, flank face 2, and cutting edge ridgeline portion 3 of tool 10, respectively.

For base material 11, any conventionally known base material of such a kind can be employed. Such a base material is preferably exemplified by cemented carbide (for example, WC-based cemented carbide, which contains not only WC but also Co, or to which a carbonitride of Ti, Ta, or Nb may be added), cermet (mainly composed of TiC, TiN, or TiCN), high-speed steel, ceramics (titanium carbide, silicon carbide, silicon nitride, aluminum nitride, or aluminum oxide), a cubic boron nitride sintered object, or a diamond sintered object. Among these various base materials, in particular, WC-based cemented carbide or cermet (in particular, TiCN-based cermet) is preferably selected. This is because such base materials are particularly excellent in balance between hardness and strength at a high temperature and have characteristics excellent as a base material for the surface-coated cutting tool in applications above.

<Coating>

Coating 12 according to the present embodiment may include other layers so long as it includes an α-Al$_2$O$_3$ layer. Examples of other layers can include a TiN layer, a TiCN layer, a TiBNO layer, a TiCNO layer, a TiB$_2$ layer, a TiAlN layer, a TiAlCN layer, a TiAlON layer, and a TiAlONC layer. An order of layering is not particularly limited.

In the present embodiment, a chemical formula such as "TiN", "TiCN," or "TiC$_x$N$_y$" in which an atomic ratio is not particularly specified in the present embodiment does not indicate that an atomic ratio of each element is limited only to "1" but encompasses all conventionally known atomic ratios.

Such a coating 12 according to the present embodiment has a function to improve various characteristics such as resistance to wear and resistance to chipping by covering base material 11.

Coating 12 has a thickness suitably of 3-30 μm (not smaller than 3 μm and not greater than 30 μm; a numerical range expressed with "–" in the present application refers to a range including upper limit and lower limit numeric values) and more preferably of 5-20 μm. When a thickness is smaller than 3 μm, resistance to wear may be insufficient, and when the thickness exceeds 30 μm, peel-off or destruction of coating 12 may occur with high frequency during intermittent working, with application of a large stress between coating 12 and base material 11.

<α-Al$_2$O$_3$ Layer>

Coating 12 according to the present embodiment includes an α-Al$_2$O$_3$ layer. Coating 12 can include one α-Al$_2$O$_3$ layer or two or more α-Al$_2$O$_3$ layers.

The α-Al$_2$O$_3$ layer contains a plurality of crystal grains of α-Al$_2$O$_3$ (aluminum oxide of which crystal structure is of an a type). Namely, this layer is composed of polycrystalline α-Al$_2$O$_3$. Normally, these crystal grains have a grain size approximately from 100 to 2000 nm. A "crystal grain boundary" is present between a plurality of crystal grains of α-Al$_2$O$_3$.

The crystal grain boundary significantly affects characteristics of a substance such as growth of crystal grains, creep characteristics, diffusion characteristics, electric characteristics, optical characteristics, and mechanical characteristics. Important characteristics to be taken into consideration include, for example, a density of crystal grain boundaries in a substance, a chemical composition of an interface, and a crystallographic texture, that is, a crystal grain boundary plane orientation and crystal misorientation. In particular, a coincidence site lattice (CSL) crystal grain boundary plays a special role. The CSL crystal grain boundary (also simply referred to as a "CSL grain boundary") is characterized by a multiplicity index E, and is defined as a ratio between a density of sites of crystal lattices of two crystal grains in contact with each other at the crystal grain boundary and a density of sites which coincide with each other when the crystal lattices are superimposed on each other. It has generally been admitted that, in a simple structure, a crystal grain boundary having a low Σ value tends to have low interface energy and special characteristics. Therefore, control of a ratio of a special crystal grain boundary and a crystal misorientation distribution estimated from a CSL model is considered as important for characteristics of a ceramic coating and a method of improving those characteristics.

A technique based on a scanning electron microscope (SEM) known as electron beam backscattered diffraction (EBSD) has recently appeared and has been used for studies of a crystal grain boundary in a ceramic substance. The EBSD technique is based on automatic analysis of a Kikuchi diffraction pattern generated by backscattered electrons.

A crystallographic orientation of each crystal grain of a substance of interest is determined after indexing of a corresponding diffraction pattern. A texture is analyzed and a grain boundary character distribution (GBCD) is determined relatively easily with EBSD, with the use of commercially available software. Crystal grain boundary misorientation of a sample population having a large interface can be determined by applying EBSD to the interfaces. Misorientation distribution is normally associated with a condition for treatment of a substance. Crystal grain boundary misorientation can be obtained based on a common orientation parameter such as an Euler angle, an angle/axis pair, or a Rodrigues' vector. The CSL model is widely used as a tool for determining characteristics.

The crystal grain boundary in the $\alpha$-$Al_2O_3$ layer according to the present embodiment includes the CSL grain boundary and the general grain boundary described above. The CSL grain boundary is constituted of the Σ3 crystal grain boundary, the Σ7 crystal grain boundary, the Σ11 crystal grain boundary, the Σ17 crystal grain boundary, the Σ19 crystal grain boundary, the Σ21 crystal grain boundary, the Σ23 crystal grain boundary, and the Σ29 crystal grain boundary. Even when any one or more crystal grain boundaries other than the Σ3 crystal grain boundary are not observed in observation with EBSD, such a case does not depart from the scope of the present embodiment so long as an effect of the present embodiment is exhibited. The general grain boundary refers to crystal grain boundaries other than the CSL crystal grain boundary. Therefore, the general grain boundary refers to a remainder resulting from exclusion of the CSL grain boundary from all grain boundaries of crystal grains of $\alpha$-$Al_2O_3$ in observation with EBSD.

The $\alpha$-$Al_2O_3$ layer according to the present embodiment satisfies (1) to (4) below.

(1) Each of the $\alpha$-$Al_2O_3$ layers on a rake face side and on a flank face side shows (001) orientation.

(2) In the $\alpha$-$Al_2O_3$ layer on the rake face side, length $L_{R3}$ of the Σ3 crystal grain boundary exceeds 80% of length $L_{R3-29}$ of the Σ3-29 crystal grain boundary and is not lower than 10% and not higher than 50% of total length $L_R$ of all grain boundaries which is a sum of $L_{R3-29}$ and length $L_{RG}$ of the general grain boundary.

(3) In the $\alpha$-$Al_2O_3$ layer on the flank face side, length $L_{F3}$ of the Σ3 crystal grain boundary exceeds 80% of length $L_{F3-29}$ of the Σ3-29 crystal grain boundary and is not lower than 10% and not higher than 50% of total length $L_F$ of all grain boundaries which is a sum of $L_{F3-29}$ and length $L_{FG}$ of the general grain boundary.

(4) Ratio $L_{R3}/L_{R3-29}$ of length $L_{R3}$ to length $L_{R3-29}$ is higher than ratio $L_{F3}/L_{F3-29}$ of length $L_{F3}$ to length $L_{F3-29}$.

(1) above will be described. The $\alpha$-$Al_2O_3$ layer on a side of each surface "showing (001) orientation" herein refers to such a condition that a ratio (an area ratio) of crystal grains ($\alpha$-$Al_2O_3$) of which normal direction to a (001) plane is within ±20° with respect to a normal direction to a surface of the $\alpha$-$Al_2O_3$ layer (a surface located on a surface side of the coating) is not lower than 50% in the $\alpha$-$Al_2O_3$ layer. Specifically, it refers to such a condition that, when a vertical cross-section of the $\alpha$-$Al_2O_3$ layer (a cross-section in parallel to the normal direction to the surface of the $\alpha$-$Al_2O_3$ layer) on each of the rake face side and the flank face side is observed with an SEM with EBSD and a result thereof is subjected to image processing with color mapping, an area ratio of the above-described crystal grains in the $\alpha$-$Al_2O_3$ layer in each observation image subjected to image processing is not lower than 50%.

All areas of the $\alpha$-$Al_2O_3$ layer in a direction of thickness are subjected to color mapping of the $\alpha$-$Al_2O_3$ layer. Namely, all regions from the surface located on a cover surface side of the $\alpha$-$Al_2O_3$ layer to the surface located on a side of the base material of the $\alpha$-$Al_2O_3$ layer is subjected to color mapping. All areas in the direction of thickness of the $\alpha$-$Al_2O_3$ layer having a thickness of the order of micrometer can be observed in one observation image. On the other hand, any area in an in-plane direction (a direction orthogonal to the direction of thickness) of the $\alpha$-$Al_2O_3$ layer should only be subjected to color mapping.

In general, as the $\alpha$-$Al_2O_3$ layer is highly oriented in line with the (001) plane, a hardness of the $\alpha$-$Al_2O_3$ layer is higher. Therefore, according to the $\alpha$-$Al_2O_3$ layer in the present embodiment which satisfies (1), occurrence of a crack due to impact applied during working can be suppressed, toughness of the cutting tool can significantly be improved, and hence high resistance to wear can be achieved.

The "surface side of the coating" means a side opposite to the side of the base material in the direction of thickness of the $\alpha$-$Al_2O_3$ layer, and when no other layer is formed on the $\alpha$-$Al_2O_3$ layer, it means the surface of the $\alpha$-$Al_2O_3$ layer.

(2) and (3) above will be described. The Σ3 crystal grain boundary is considered as lowest in grain boundary energy among CSL crystal grain boundaries of $\alpha$-$Al_2O_3$, and hence it is considered that mechanical characteristics (in particular, resistance to plastic deformation) can be enhanced by increasing a ratio thereof in all CSL crystal grain boundaries. Therefore, in the present embodiment, the all CSL crystal grain boundaries are denoted as the Σ3-29 crystal grain boundary, and length $L_{R3}$ of the Σ3 crystal grain boundary in the $\alpha$-$Al_2O_3$ layer on the rake face side is defined as exceeding 80% of length $L_{R3-29}$ of the Σ3-29 crystal grain boundary in the $\alpha$-$Al_2O_3$ layer on the rake face side and length $L_{F3}$ of the Σ3 crystal grain boundary in the $\alpha$-$Al_2O_3$ layer on the flank face side is defined as exceeding 80% of length $L_{F3-29}$ of the Σ3-29 crystal grain boundary in the $\alpha$-$Al_2O_3$ layer on the flank face side.

Length $L_{R3}$ refers to a total length of the Σ3 crystal grain boundary in a field of view observed in observation with an SEM with EBSD of the $\alpha$-$Al_2O_3$ layer on the rake face side, and length $L_{R3-29}$ refers to the total sum of lengths of the Σ3 crystal grain boundary, the Σ7 crystal grain boundary, the Σ11 crystal grain boundary, the Σ17 crystal grain boundary, the Σ19 crystal grain boundary, the Σ21 crystal grain boundary, the Σ23 crystal grain boundary, and the Σ29 crystal grain boundary in a field of view observed in observation with an SEM with EBSD of the α-$Al_2O_3$ layer on the rake face side. Similarly, length $L_{F3}$ refers to a total length of the Σ3 crystal grain boundary in a field of view observed in observation with an SEM with EBSD of the α-$Al_2O_3$ layer on the flank face side, and length $L_{F3-29}$ refers to the total sum of lengths of the Σ3 crystal grain boundary, the Σ7 crystal grain boundary, the Σ11 crystal grain boundary, the Σ17 crystal grain boundary, the Σ19 crystal grain boundary, the Σ21 crystal grain boundary, the Σ23 crystal grain boundary, and the Σ29 crystal grain boundary in a field of view observed in observation with an SEM with EBSD of the α-$Al_2O_3$ layer on the flank face side.

Length $L_{R3}$ is more preferably 83% or higher and further preferably 85% or higher of length $L_{R3-29}$. This is also applicable to length $L_{F3}$, and length $L_{F3}$ is more preferably 83% or higher and further preferably 85% or higher of length $L_{F3-29}$. A numeric value is thus preferably as high as possible, and an upper limit thereof does not have to be defined. From a point of view of a thin film being polycrystalline, however, the upper limit is 99% or lower.

Since the Σ3 crystal grain boundary has high conformity as is clear also from the fact that it is low in grain boundary energy, two crystal grains of which grain boundary is defined by the Σ3 crystal grain boundary exhibit a behavior similar to a behavior of a single crystal or twin crystals and tend to be coarser. As crystal grains are coarser, characteristics of a coating such as resistance to chipping lower and hence coarsening should be suppressed. Therefore, in the present embodiment, the suppression effect above is ensured by defining respective lengths $L_{R3}$ and $L_{F3}$ of the Σ3 crystal grain boundary to be not lower than 10% and not higher than 50% of total lengths $L_R$ and $L_F$ of all grain boundaries in the α-$Al_2O_3$ layer located on the sides of the rake face and the flank face.

When respective lengths $L_{R3}$ and $L_{F3}$ of the Σ3 crystal grain boundary exceed 50% of total lengths $L_R$ and $L_F$ of all grain boundaries on the side of respective surfaces, crystal grains unfavorably become coarser, and when the lengths are lower than 10%, excellent mechanical characteristics cannot be obtained. A more preferred range of lengths $L_{R3}$ and $L_{F3}$ of the Σ3 crystal grain boundary is from 20 to 45% and a further preferred range is from 30 to 40%.

All grain boundaries refer to the CSL crystal grain boundary and the general crystal grain boundary other than the CSL crystal grain boundary as being added. Therefore, "total length $L_R$ of all grain boundaries" on the side of the rake face can be expressed as the "sum of length $L_{R3-29}$ of the Σ3-29 crystal grain boundary and length $L_{RG}$ of the general grain boundary" and "total length $L_F$ of all grain boundaries" on the side of the flank face can be expressed as the "sum of length $L_{F3-29}$ of the Σ3-29 crystal grain boundary and length $L_{FG}$ of the general grain boundary."

(4) above will be described. The α-$Al_2O_3$ layer satisfying (4) is relatively high in ratio occupied by the Σ3 crystal grain boundary in the CSL grain boundary in the α-$Al_2O_3$ layer on the side of the rake face and relatively low in ratio of the Σ3 crystal grain boundary in the CSL grain boundary in the α-$Al_2O_3$ layer on the side of the flank face. Therefore, the α-$Al_2O_3$ layer satisfying (2) and (3) and further satisfying (4) is particularly excellent in resistance to plastic deformation on the side of the rake face and can sufficiently suppress lowering in characteristics of the coating such as resistance to chipping attributed to too much Σ3 crystal grain boundary on the side of the flank face.

In a cutting process under a low-speed condition and a high-feed condition (hereinafter also denoted as a "low-speed and high-feed cutting process"), chips produced from a work material tend to apply great shear stress to the side of the rake face of the tool. The α-$Al_2O_3$ layer satisfying (2) to (4) can withstand great shear stress applied to the side of the rake face, and hence long life can be maintained also in the low-speed and high-feed cutting process under particularly severe cutting conditions on the side of the rake face.

A difference $\{(L_{R3}/L_{R3-29})-(L_{F3}/L_{F3-29})\}$ between ratio $L_{R3}/L_{R3-29}$ and ratio $L_{F3}/L_{F3-29}$ is preferably from 1 to 10. In this case, balance between improvement in resistance to plastic deformation on the side of the rake face and improvement in resistance to chipping on the side of the flank face is excellent. The difference is more preferably from 4 to 6. In order to satisfy such a difference, for example, length $L_{R3}$ of the Σ3 crystal grain boundary is preferably from 90 to 99% and more preferably from 91 to 98% of length $L_{R3-29}$ of the Σ3-29 crystal grain boundary. Length $L_{F3}$ of the Σ3 crystal grain boundary is preferably 93% or lower and more preferably lower than 90% of length $L_{F3-29}$ of the Σ3-29 crystal grain boundary.

In the present embodiment, whether or not the α-$Al_2O_3$ layer satisfies (1) can be determined as follows.

Initially, an α-$Al_2O_3$ layer is formed on the base material based on a manufacturing method which will be described later. Then, the formed α-$Al_2O_3$ layer (including the base material) on the side of the rake face is cut to obtain a cross-section perpendicular to the α-$Al_2O_3$ layer (that is, cut to expose a cut surface obtained by cutting the α-$Al_2O_3$ layer along a plane including a normal line to the surface of the α-$Al_2O_3$ layer). Thereafter, the cut surface is polished with water resistant sandpaper (which contains an SiC grain abrasive as an abrasive).

The α-$Al_2O_3$ layer is cut, for example, in such a manner that the surface of the α-$Al_2O_3$ layer (when another layer is formed on the α-$Al_2O_3$ layer, a surface of the coating) is fixed with the use of wax or the like as being in intimate contact to a sufficiently large flat plate for holding, and thereafter the α-$Al_2O_3$ layer is cut in a direction perpendicular to the flat plate with a cutter with a rotary blade (cut such that the rotary blade and the flat plate are as perpendicular as possible to each other). Any portion of the α-$Al_2O_3$ layer can be cut so long as the α-$Al_2O_3$ layer is cut in such a perpendicular direction.

Polishing is performed successively with water resistant sandpaper #400, #800, and #1500 (the number (#) of the water resistant sandpaper means a difference in grain size of the abrasive, and a greater number indicates a smaller grain size of the abrasive).

In succession, the polished surface is further smoothened through ion milling treatment with the use of Ar ions. Conditions for ion milling treatment are as follows.

Acceleration voltage: 6 kV

Irradiation angle: 0° from a direction of normal to the surface of the α-$Al_2O_3$ layer (that is, a linear direction in parallel to a direction of thickness of the α-$Al_2O_3$ layer at the cut surface)

Irradiation time period: 6 hours

A position of cutting is set to avoid at least a portion in the vicinity of cutting edge ridgeline portion 3. Specifically, referring to FIG. 3, a region connecting an outer edge $A_1$ of a region where a surface in contact with rake face 1 (shown with a dotted line extending laterally in FIG. 3) and rake face 1 are in contact with each other and an outer edge $A_2$ of a region where a surface in contact with flank face 2 (shown with a dotted line extending vertically in FIG. 3) and flank face 2 are in contact with each other is regarded as cutting edge ridgeline portion 3, and a position distant by 0.2 mm or greater from outer edge $A_1$ which is an end portion of cutting edge ridgeline portion 3 (a position distant from outer edge $A_1$ to the left in FIG. 3) is applied as a position of a cross-section. Similarly also in a cross-section on the side of flank face 2 of the $\alpha$-$Al_2O_3$ layer, a position distant by 0.2 mm or greater from outer edge $A_2$ which is an end portion of cutting edge ridgeline portion 3 (a position distant from outer edge $A_2$ in a downward direction in FIG. 3) is applied as a position of a cross-section.

The smoothened polished surface is observed with an SEM with EBSD. Zeiss Supra 35 VP (manufactured by CARL ZEISS) including an HKL NL02 EBSD detector is employed as the SEM. EBSD data is successively collected by individually positioning focused electron beams onto each pixel.

A normal line to a sample surface (a smoothened cross-section of the $\alpha$-$Al_2O_3$ layer) is inclined by 70° with respect to incident beams, and analysis is conducted at 15 kV. In order to avoid a charging effect, a pressure of 10 Pa is applied. A high current mode is set in conformity with a diameter of an opening of 60 μm or 120 μm. Data is collected stepwise at 0.1 μm/step, for 500×300 points corresponding to a plane region of 50×30 μm on the polished surface.

Then, with commercially available software (a trademark: "orientation Imaging microscopy Ver 6.2" manufactured by EDAX Inc.), an angle formed between a direction of normal to the (001) plane of each measured pixel and a direction of normal to the surface of the $\alpha$-$Al_2O_3$ layer (the surface located on the surface side of the coating) (that is, the linear direction in parallel to the direction of thickness of the $\alpha$-$Al_2O_3$ layer at the cut surface) is calculated, and a color map in which a pixel having the angle within ±20° is selected is created.

Specifically, with the technique according to "Crystal Direction MAP" included in the software, a color map of Tolerance of 20° (a difference in direction being within ±20°) between the direction of normal to the surface of the $\alpha$-$Al_2O_3$ layer and the direction of normal to the (001) plane of each measured pixel is created. Then, an area ratio of the pixel is calculated based on this color map and the area ratio being 50% or higher is defined as "the $\alpha$-$Al_2O_3$ layer on the side of the rake face showing (001) orientation."

Similarly, whether or not the $\alpha$-$Al_2O_3$ layer on the side of the flank face shows (001) orientation is determined. When it is confirmed that the $\alpha$-$Al_2O_3$ layer on the side of any surface shows (001) orientation, that is, a ratio of crystal grains ($\alpha$-$Al_2O_3$) of which direction of normal to the (001) plane is within ±20° with respect to the direction of normal to the surface (the surface located on the surface side of the coating) of the $\alpha$-$Al_2O_3$ layer is not lower than 50%, the $\alpha$-$Al_2O_3$ layer satisfies (1).

In the present embodiment, whether or not each of the $\alpha$-$Al_2O_3$ layer on the side of the rake face and the $\alpha$-$Al_2O_3$ layer on the side of the flank face satisfies (2) and (3) and whether or not it further satisfies (4) can be determined as follows.

Initially, the $\alpha$-$Al_2O_3$ layer on the side of the rake face is cut to obtain a cross-section perpendicular to the $\alpha$-$Al_2O_3$ layer similarly to the above, and thereafter polishing and smoothing treatment are similarly carried out. Then, the cut surface thus treated is observed with an SEM with EBSD as above.

A normal line to a sample surface (a smoothened cross-section of the $\alpha$-$Al_2O_3$ layer) is inclined by 70° with respect to incident beams, and analysis is conducted at 15 kV. In order to avoid a charging effect, a pressure of 10 Pa is applied. A high current mode is set in conformity with a diameter of an opening of 60 μm or 120 μm. Data is collected stepwise at 0.1 μm/step, for 500×300 points corresponding to a plane region of 50×30 μm on the polished surface.

Data is processed with and without noise filtering. Noise filtering and crystal grain boundary character distribution are determined by using commercially available software (a trademark: "orientation Imaging microscopy Ver 6.2" manufactured by EDAX Inc.). The crystal grain boundary character distribution is analyzed based on data available from Grimmer (H. Grimmer, R. Bonnet, Philosophical Magazine A 61 (1990), 493-509). With Brandon criterion ($\Delta\Theta<\Theta_0(\Sigma)^{-0.5}$, where $\Theta_0=15°$), a tolerance of an experimental value from a theoretical value is taken into account (D. Brandon Acta metall. 14 (1966), 1479-1484). Special crystal grain boundaries corresponding to any $\Sigma$ value are counted, and the count is expressed as a ratio to all crystal grain boundaries.

As set forth above, length $L_{R3}$ of the $\Sigma 3$ crystal grain boundary, length $L_{R3-29}$ of the $\Sigma 3$-29 crystal grain boundary, and total length $L_R$ of all grain boundaries in the $\alpha$-$Al_2O_3$ layer on the side of the rake face can be found. Similarly, length $L_{F3}$ of the $\Sigma 3$ crystal grain boundary, length $L_{F3-29}$ of the $\Sigma 3$-29 crystal grain boundary, and total length $L_F$ of all grain boundaries in the $\alpha$-$Al_2O_3$ layer on the side of the flank face can be found. Based on the found values, whether or not the $\alpha$-$Al_2O_3$ layer on the side of the rake face and the $\alpha$-$Al_2O_3$ layer on the side of the flank face satisfy (2) and (3) can be determined and whether or not the $\alpha$-$Al_2O_3$ layers further satisfy (4) can be determined.

<Thickness of $\alpha$-$Al_2O_3$ Layer>

The $\alpha$-$Al_2O_3$ layer preferably has a thickness from 2 to 20 μm. The excellent effect as above can thus be exhibited. The thickness is more preferably from 2 to 15 μm and further preferably from 2 to 10 μm.

When the thickness is smaller than 2 μm, the excellent effect as above may not sufficiently be exhibited. When the thickness exceeds 20 μm, interface stress attributed to a difference in coefficient of linear expansion between the $\alpha$-$Al_2O_3$ layer and another layer such as an underlying layer increases and crystal grains of $\alpha$-$Al_2O_3$ may come off. Such a thickness can be determined by observing a vertical cross-section of the base material and the coating with a scanning electron microscope (SEM).

<Surface Roughness of $\alpha$-$Al_2O_3$ Layer>

The $\alpha$-$Al_2O_3$ layer has surface roughness Ra preferably less than 0.2 μm. Thus, not only a coefficient of friction between chips and a cutting edge of a tool lowers and resistance to chipping improves but also stable capability to discharge chips can be exhibited. Surface roughness Ra is more preferably less than 0.15 μm and further preferably less than 0.10 μm. Surface roughness Ra is thus preferably as low as possible, and a lower limit thereof does not have to be defined. From a point of view of the fact that a coating is affected by a surface texture of the base material, however, the lower limit is 0.05 μm or greater.

In the present application, surface roughness Ra means arithmetical mean roughness Ra defined under JIS B 0601 (2001).

<Compressive Stress of α-$Al_2O_3$ Layer>

The α-$Al_2O_3$ layer preferably includes a point where an absolute value for compressive stress is maximal, in a region within 2 μm from a surface side of the coating, and the absolute value for compressive stress at the point is lower than 1 GPa. Thus, sudden breakage of a cutting edge due to mechanical and thermal fatigue of the cutting edge of the tool which occurs during an intermittent cutting process is suppressed and a manpower saving/energy saving effect can be exhibited. The absolute value is more preferably lower than 0.9 GPa and further preferably lower than 0.8 GPa. Though the lower limit of the absolute value is not particularly limited, from a point of view of balance between resistance to wear and resistance to breakage, the lower limit is not lower than 0.2 GPa.

Compressive stress in the present embodiment can be measured with the conventionally known $\sin^2\psi$ method and constant penetration depth method which use X-rays.

<$TiC_xN_y$ Layer>

The coating according to the present embodiment can include a $TiC_xN_y$ layer between the base material and the α-$Al_2O_3$ layer. This $TiC_xN_y$ layer preferably contains $TiC_xN_y$ satisfying atomic ratio relation of $0.6 \leq x/(x+y) \leq 0.8$. Adhesion between the base material and the α-$Al_2O_3$ layer is thus improved.

The atomic ratio is more preferably $0.65 \leq x/(x+y) \leq 0.75$ and further preferably $0.67 \leq x/(x+y) \leq 0.72$. When $x/(x+y)$ is smaller than 0.6, resistance to wear may be insufficient, and when it exceeds 0.8, resistance to chipping may be insufficient.

<Manufacturing Method>

The surface-coated cutting tool according to the present embodiment can be manufactured by forming a coating on a base material through chemical vapor deposition (CVD). When a layer other than the α-$Al_2O_3$ layer is formed in the coating, such a layer can be formed under conventionally known conditions with the use of a chemical vapor deposition apparatus. The α-$Al_2O_3$ layer can be formed as below.

$AlCl_3$, $HCl$, $CO_2$, $CO$, $H_2S$, $O_2$, and $H_2$ are employed as source gases. Amounts of blend of $AlCl_3$, $HCl$, $CO_2$, $CO$, $H_2S$, and $O_2$ are set to 3 to 5 volume %, 4 to 6 volume %, 0.5 to 2 volume %, 1.5 to 3 volume %, 1 to 5 volume %, and 0.0001 to 0.01 volume %, respectively, and $H_2$ is adopted as the remainder. Volume ratios of $1 \leq CO/CO_2 \leq 5$, $0.1 \leq CO_2/H_2S \leq 1$, $0.1 \leq CO_2/AlCl_3 \leq 1$, and $0.5 \leq AlCl_3/HCl \leq 1$ are adopted.

Though the source gas is blown to the base material arranged in a reaction vessel in the chemical vapor deposition apparatus, a direction of injection of the source gas is adjusted such that the flank face of the base material is substantially perpendicular to the direction of injection of the source gas and the rake face of the base material is substantially in parallel to the direction of injection of the source gas. Various conditions for chemical vapor deposition include a temperature from 950 to 1050° C., a pressure from 1 to 5 kPa, and a gas flow rate (a total amount of gases) from 50 to 100 L/min. A speed of introduction of the source gas into the reaction vessel is set to 1.7 to 3.5 m/sec.

After the α-$Al_2O_3$ layer is once formed through chemical vapor deposition under the conditions described above, annealing is performed. Conditions for annealing include a temperature from 1050 to 1080° C., a pressure from 50 to 100 kPa, and a time period from 120 to 300 minutes. An atmosphere for this annealing is obtained by feeding $H_2$ and argon (Ar) each at a flow rate of 20 to 30 L/min.

The α-$Al_2O_3$ layer according to the present embodiment having a desired thickness can thus be formed. In particular, by setting an amount of blend of $O_2$ and an amount of blend of CO in the source gas to the ranges above and adjusting a direction of injection of the source gas such that the flank face of the base material is substantially perpendicular to the direction of injection of the source gas and the rake face of the base material is substantially in parallel to the direction of injection of the source gas, the α-$Al_2O_3$ layer satisfying (2) to (4) can be formed. The reason is estimated as follows.

$O_2$ is more reactive than other gases such as $CO_2$, and it has a function to increase the number of nuclei of α-$Al_2O_3$ or to increase a rate of film formation. $O_2$ can also have a function to lower a ratio of the Σ3 crystal grain boundary in the CSL crystal grain boundary. This is because generation of the Σ3 crystal grain boundary which is the crystal grain boundary having high conformity is less likely when a rate of film formation is too high. CO has a function as an $O_2$ reaction inhibitor, that is, a function to suppress diffusion and adsorption of $O_2$ to the surface of the base material.

On the side of the rake face substantially in parallel to the direction of injection of the source gas, a flux density of a source gas tends to relatively be high, and on the side of the flank face substantially perpendicular to the direction of injection of the source gas, a flux density of a source gas tends to be relatively low. Namely, a residence time of a source gas tends to be short on the side of the rake face, and a residence time of a source gas tends to be long on the side of the flank face. A rate of diffusion of a gas is characterized by being inversely proportional to a root of a molecular weight of the gas. Therefore, $O_2$ larger in molecular weight than CO is lower in rate of diffusion than CO.

Therefore, when ratios of blend of $O_2$ and CO are set to the respective ranges above, apparently, diffusion of $O_2$ on the side of the flank face is more advantageous than diffusion of $O_2$ on the side of the rake face, whereas diffusion of CO on the side of the rake face is more advantageous than diffusion of CO on the side of the flank face. Thus, decrease in the Σ3 crystal grain boundary attributed to the function of $O_2$ is caused on the side of the flank face, and consequently, a ratio of the Σ3 crystal grain boundary on the side of the rake face is higher than on the side of the flank face.

Annealing as above after film formation can prevent an impurity such as sulfur from remaining in the α-$Al_2O_3$ layer. Therefore, the method of manufacturing the α-$Al_2O_3$ layer according to the present embodiment is particularly excellent.

EXAMPLES

Though the present invention will be described in further detail below with reference to Examples, the present invention is not limited thereto.

<Preparation of Base Material>

Two types of base materials of a base material P and a base material K shown in Table 1 below were prepared. Specifically, a base material made of cemented carbide and having a shape of CNMG120408NUX (manufactured by Sumitomo Electric Industries, Ltd.) was obtained by uniformly mixing source material powders as formulated as shown in Table 1, forming the powders into a prescribed shape by applying a pressure, and sintering the formed powders for 1 to 2 hours at 1300 to 1500° C.

TABLE 1

| | Formulated Composition (Mass %) | | | | | | |
|---|---|---|---|---|---|---|---|
| | Co | TiC | VC | $Cr_3C_2$ | NbC | TaC | WC |
| P | 5.0 | 2.0 | — | 1.0 | 1.0 | 2.0 | Remainder |
| K | 8.0 | 5.0 | 0.3 | 0.5 | 0.5 | 2.0 | Remainder |

<Formation of Coating>

A coating was formed on a surface of each base material obtained as above. Specifically, a coating was formed on the base material through chemical vapor deposition, with the base material being set in a chemical vapor deposition apparatus. The base material was arranged in the reaction vessel such that the rake face was substantially in parallel to a direction of injection of a gas and the flank face was substantially orthogonal to the direction of injection of the gas.

Conditions for forming the coating are as shown in Tables 2 and 3 below. Table 2 shows conditions for forming each layer other than the $\alpha$-$Al_2O_3$ layer, and Table 3 shows conditions for forming the $\alpha$-$Al_2O_3$ layer. TiBNO and TiCNO in Table 2 represent an intermediate layer in Table 5 which will be described later, and other components correspond to layers except for the $\alpha$-$Al_2O_3$ layer in Table 5. The $TiC_xN_y$ layer is composed of $TiC_xN_y$ in which an atomic ratio x/(x+y) is set to 0.7.

As shown in Table 3, there are 10 conditions of A to G and X to Z for forming the $\alpha$-$Al_2O_3$ layer, and A to G correspond to the conditions in Examples and X to Z correspond to the conditions in Comparative Examples (conventional art). In formation of the $\alpha$-$Al_2O_3$ layer, a speed of introduction of a source gas was set to 2 m/sec., and a gas pipe for injection of the source gas was rotated at 2 rpm while the base material was fixed. Only the $\alpha$-$Al_2O_3$ layer in Examples formed under conditions A to G was annealed under conditions of 1050° C., 50 kPa, a flow rate of $H_2$ being set to 20 L/min., and a flow rate of Ar being set to 30 L/min. for an annealing time period shown in Table 3.

For example, formation condition A indicates that the $\alpha$-$Al_2O_3$ layer is formed by supplying a source gas composed of 3.2 volume % of $AlCl_3$, 4.0 volume % of HCl, 1.0 volume % of $CO_2$, 3.0 volume % of CO, 2 volume % of $H_2S$, 0.003 volume % of $O_2$, and remainder $H_2$ to the chemical vapor deposition apparatus, performing chemical vapor deposition under conditions of a pressure of 3.5 kPa, a temperature of 1000° C., and a flow rate (a total amount of gases) of 70 L/min., and thereafter performing annealing for 180 minutes under the conditions above.

Each layer other than the $\alpha$-$Al_2O_3$ layer shown in Table 2 was formed similarly through chemical vapor deposition, except for not performing annealing. The "remainder" in Table 2 indicates that $H_2$ occupies the remainder of the source gases. The "total amount of gases" indicates a total volume flow rate introduced into the chemical vapor deposition apparatus per unit time, with a gas in a standard condition (0° C. and 1 atmospheric pressure) being defined as the ideal gas (also applicable to the $\alpha$-$Al_2O_3$ layer in Table 3). A thickness of each layer was adjusted by adjusting as appropriate a time period for film formation (a rate of film formation of each layer was approximately from 0.5 to 2.0 μm/hour).

TABLE 2

| | | Conditions for Film Formation | | |
|---|---|---|---|---|
| | Composition of Source Gas (Volume %) | Pressure (kPa) | Temperature (° C.) | Total Amount of Gases (L/min) |
| TiN (Underlying Layer) | $TiCl_4$ = 2.0%, $N_2$ = 39.7%, $H_2$ = Remainder | 35 | 910 | 55.0 |
| TiN (Outermost Layer) | $TiCl_4$ = 0.5%, $N_2$ = 41.2%, $H_2$ = Remainder | 80 | 1000 | 75.0 |
| $TiC_xN_y$ | $TiCl_4$ = 2.0%, $CH_3CN$ = 0.7%, $C_2H_4$ = 1.5%, $H_2$ = Remainder | 9 | 820 | 69.0 |
| TiBNO | $TiCl_4$ = 36.7%, $BCl_3$ = 0.1%, CO = 1.6%, $CO_2$ = 1.7%, $N_2$ = 61.7%, $H_2$ = Remainder | 6.5 | 970 | 56.2 |
| TiCNO | $TiCl_4$ = 2.1%, CO = 3.2%, $CH_4$ = 2.8%, $N_2$ = 23.7%, $H_2$ = Remainder | 20.0 | 1020 | 50.5 |

TABLE 3

| | | Composition of Source Gas (Volume %) | | | | | | | Volume Ratio | | | | Conditions for Film Formation | | | |
|---|---|---|---|---|---|---|---|---|---|---|---|---|---|---|---|---|---|
| | | $AlCl_3$ | HCl | $CO_2$ | CO | $H_2S$ | $O_2$ | $H_2$ | CO/$CO_2$ | $CO_2$/$H_2S$ | $CO_2$/$AlCl_3$ | $AlCl_3$/HCl | Pressure (kPa) | Temperature (° C.) | Total Amount of Gases (L/min) | Annealing Time (min) |
| Example | A | 3.2 | 4.0 | 1.0 | 3.0 | 2 | 0.0030 | Remainder | 3.0 | 0.50 | 0.3 | 0.8 | 3.5 | 1000 | 70 | 180 |
| | B | 3.5 | 5.0 | 0.8 | 2.5 | 1.8 | 0.0060 | Remainder | 3.1 | 0.44 | 0.2 | 0.7 | 3.5 | 1000 | 70 | 180 |
| | C | 3.0 | 6.0 | 0.5 | 1.5 | 1.6 | 0.0800 | Remainder | 3.0 | 0.31 | 0.2 | 0.5 | 3.0 | 1010 | 60 | 120 |
| | D | 4.4 | 5.0 | 1.0 | 2.0 | 1.1 | 0.0005 | Remainder | 2.0 | 0.91 | 0.2 | 0.9 | 4.0 | 980 | 75 | 240 |
| | E | 5.2 | 6.0 | 1.6 | 3.0 | 2 | 0.0075 | Remainder | 1.9 | 0.80 | 0.3 | 0.9 | 3.5 | 1000 | 70 | 180 |
| | F | 3.8 | 4.5 | 2.0 | 2.5 | 3 | 0.0009 | Remainder | 1.3 | 0.67 | 0.5 | 0.8 | 4.0 | 980 | 80 | 300 |
| | G | 5.0 | 5.5 | 1.0 | 3.0 | 5 | 0.0100 | Remainder | 3.0 | 0.20 | 0.2 | 0.9 | 3.0 | 1020 | 60 | 180 |

TABLE 3-continued

| | | Composition of Source Gas (Volume %) | | | | | | | Volume Ratio | | | | Conditions for Film Formation | | | |
|---|---|---|---|---|---|---|---|---|---|---|---|---|---|---|---|---|
| | | AlCl$_3$ | HCl | CO$_2$ | CO | H$_2$S | O$_2$ | H$_2$ | CO/CO$_2$ | CO$_2$/H$_2$S | CO$_2$/AlCl$_3$ | AlCl$_3$/HCl | Pressure (kPa) | Temperature (° C.) | Total Amount of Gases (L/min) | Annealing Time (min) |
| Comparative Example | X | 10 | 5.0 | 15 | — | 0.2 | — | Remainder | — | 75 | 1.5 | 2.0 | 5.0 | 1050 | 50 | — |
| | Y | 2 | 2.0 | 3 | — | 0.5 | — | Remainder | — | 6 | 1.5 | 1.0 | 8.0 | 1020 | 55 | — |
| | Z | 2 | 1.5 | 6 | — | 0.05 | — | Remainder | — | 120 | 3.0 | 1.3 | 6.0 | 1020 | 50 | — |

<Fabrication of Surface-Coated Cutting Tool>

Surface-coated cutting tools in Examples 1 to 15 and Comparative Examples 1 to 6 shown in Tables 4 and 5 below were each fabricated by forming a coating on the base material under the conditions in Tables 2 and 3.

In Tables 4 and 5, a composition and a thickness of each coating were determined with an SEM-EDX (scanning electron microscope-energy dispersive X-ray spectrometry), and a length of the Σ3 crystal grain boundary, a length of the Σ3-29 crystal grain boundary, and a total length of all grain boundaries of the α-Al$_2$O$_3$ layer were determined with the method described above. A ratio (%) of crystal grains (α-Al$_2$O$_3$) of which normal direction to the (001) plane is within ±20° with respect to the normal direction to the surface of the α-Al$_2$O$_3$ layer (the surface located on the surface side of the coating) in the α-Al$_2$O$_3$ layers on the side of the rake face and on the side of the flank face was determined with the method described above.

For example, referring to Table 4, the surface-coated cutting tool in Example 1 has a coating having a total thickness of 18.7 μm formed on the base material, by adopting base material P shown in Table 1 as the base material, forming a TiN layer having a thickness of 0.9 μm as an underlying layer on the surface of base material P under the conditions in Table 2, forming a TiC$_x$N$_y$ layer having a thickness of 10.0 μm on the underlying layer under the conditions in Table 2, forming a TiBNO layer having a thickness of 0.5 μm as an intermediate layer on the TiC$_x$N$_y$ layer under the conditions in Table 2, fabricating the α-Al$_2$O$_3$ layer having a thickness of 6.6 μm on the intermediate layer under the formation condition A in Table 3, and thereafter forming a TiN layer having a thickness of 0.7 μm as an outermost layer under the conditions in Table 2. Blank fields in Table 4 indicate absence of a corresponding layer.

Referring to Table 5, in Example 1, in the α-Al$_2$O$_3$ layer on the side of the rake face, length $L_{R3}$ of the Σ3 crystal grain boundary is 91% of length $L_{R3-29}$ of the Σ3-29 crystal grain boundary and 21% of total length $L_R$ of all grain boundaries. In the α-Al$_2$O$_3$ layer on the side of the flank face, length $L_{F3}$ of the Σ3 crystal grain boundary is 85% of length $L_{F3-29}$ of the Σ3-29 crystal grain boundary and 18% of total length $L_F$ of all grain boundaries. A value calculated by subtracting a ratio ($L_{F3}/L_{F3-29}$) (%) from a ratio ($L_{R3}/L_{R3-29}$) (%) is shown in a field of "($L_{R3}/L_{R3-29}$)−($L_{F3}/L_{F3-29}$)". Since this value is "+", it can be seen that ratio $L_{R3}/L_{R3-29}$ is higher than ratio $L_{F3}/L_{F3-29}$. This α-Al$_2$O$_3$ layer shows (001) orientation on the side of the rake face and on the side of the flank face.

Since the α-Al$_2$O$_3$ layer in each of Comparative Examples 1 to 6 was formed under the conditions according to the conventional art which are not in accordance with the method of the present invention, this α-Al$_2$O$_3$ layer was formed of a crystal texture not exhibiting characteristics as in the present invention (see Table 5).

TABLE 4

| | Construction of Coating (μm) | | | | | | |
|---|---|---|---|---|---|---|---|
| | Type of Base Material | Underlying Layer (TiN layer) | TiC$_x$N$_y$ Layer | Intermediate Layer | α-Al$_2$O$_3$ Layer | Outermost Layer (TiN layer) | Total Thickness of Coating (μm) |
| Example 1 | P | 0.9 | 10.0 | TiBNO (0.5) | A (6.6) | 0.7 | 18.7 |
| Example 2 | P | 0.5 | 11.2 | TiBNO (0.5) | C (5.9) | 1.0 | 19.1 |
| Example 3 | P | 0.5 | 12.8 | TiBNO (0.7) | E (5.7) | 0.5 | 20.2 |
| Example 4 | P | 0.6 | 9.7 | TiBNO (0.7) | B (6.0) | 1.0 | 18.0 |
| Example 5 | P | 0.9 | 9.5 | TiCNO (0.8) | F (6.3) | 0.5 | 18.0 |
| Example 6 | P | 0.6 | 13.0 | TiCNO (0.5) | D (5.7) | — | 19.8 |
| Example 7 | P | 0.5 | 10.2 | TiCNO (0.6) | G (4.8) | 1.0 | 17.1 |
| Example 8 | K | 0.6 | 6.5 | TiBNO (0.5) | D (3.0) | — | 10.6 |
| Example 9 | K | 0.9 | 4.5 | TiBNO (0.6) | A (3.5) | 0.8 | 10.3 |
| Example 10 | K | 0.5 | 5.8 | TiCNO (0.6) | G (4.2) | 1.0 | 12.1 |
| Example 11 | K | 0.9 | 6.1 | TiBNO (0.8) | F (2.8) | 0.5 | 11.1 |
| Example 12 | K | 0.5 | 6.3 | TiBNO (0.5) | C (2.5) | 1.1 | 10.9 |
| Example 13 | K | 0.5 | 7.0 | TiCNO (0.8) | E (4.0) | 0.5 | 12.8 |
| Example 14 | K | 0.7 | 5.8 | TiCNO (0.8) | B (3.6) | 1.0 | 11.9 |
| Example 15 | K | 0.6 | 6.0 | TiCNO (1.0) | D (4.2) | — | 11.8 |
| Comparative Example 1 | P | 0.5 | 11.2 | TiCNO (0.5) | X (5.8) | 1.0 | 19.0 |
| Comparative Example 2 | P | 0.5 | 11.4 | TiCNO (0.7) | Y (6.1) | — | 18.7 |
| Comparative Example 3 | P | 0.5 | 10.8 | TiCNO (0.5) | Z (6.3) | 1.2 | 19.3 |
| Comparative Example 4 | K | 0.5 | 5.5 | TiCNO (0.6) | X (3.5) | 1 | 11.1 |

TABLE 4-continued

| | Type of Base Material | Construction of Coating (μm) | | | | | |
|---|---|---|---|---|---|---|---|
| | | Underlying Layer (TiN layer) | $TiC_xN_y$ Layer | Intermediate Layer | $\alpha$-$Al_2O_3$ Layer | Outermost Layer (TiN layer) | Total Thickness of Coating (μm) |
| Comparative Example 5 | K | 0.5 | 5.7 | TiCNO (0.7) | Y (4.0) | — | 10.9 |
| Comparative Example 6 | K | 0.5 | 4.8 | TiCNO (0.5) | Z (3.8) | 1.1 | 10.7 |

TABLE 5

| | | $L_{R3}/L_{R3\text{-}29}$ | $L_{R3}/L_R$ | $L_{F3}/L_{F3\text{-}29}$ | $L_{F3}/L_F$ | $(L_{R3}/L_{R3\text{-}29})$ − $(L_{F3}/L_{F3\text{-}29})$ | Ratio of (001) Orientation | |
|---|---|---|---|---|---|---|---|---|
| | | (%) | (%) | (%) | (%) | | Rake Face | Flank Face |
| Example | A | 91 | 21 | 85 | 18 | 6 | 62 | 55 |
| | B | 88 | 18 | 82 | 16 | 6 | 57 | 52 |
| | C | 94 | 22 | 88 | 20 | 6 | 72 | 57 |
| | D | 85 | 10 | 80 | 9 | 5 | 56 | 51 |
| | E | 85 | 13 | 80 | 12 | 5 | 55 | 51 |
| | F | 87 | 15 | 83 | 11 | 4 | 57 | 53 |
| | G | 98 | 25 | 93 | 20 | 5 | 75 | 71 |
| Comparative Example | X | 75 | 3 | 74 | 5 | 1 | 52 | 50 |
| | Y | 82 | 5 | 81 | 7 | 1 | 42 | 40 |
| | Z | 50 | 1 | 51 | 2 | −1 | 13 | 15 |

<Cutting Test>

Four types of cutting tests below were conducted on the surface-coated cutting tools obtained above. The cutting test below belongs to the low-speed and high-feed cutting process.

<Cutting Test 1>

For the surface-coated cutting tools in Examples and Comparative Examples shown in Table 6 below, a time period of cutting until an amount of crater wear (Kt) reached 0.20 mm under cutting conditions below was counted. Table 6 shows results. A longer time period of cutting indicates better resistance to wear and longer life of the tool.

<Conditions for Cutting>

Work material: Cutting of outer circumference of round rod of SCM440
Peripheral speed: 150 m/min.
Feed rate: 0.6 mm/rev
Cutting depth: 2.0 mm
Coolant: used

TABLE 6

| | Time Period of Cutting (Minute) |
|---|---|
| Example 1 | 30 |
| Example 2 | 33 |
| Example 3 | 29 |
| Example 4 | 28 |
| Example 5 | 25 |
| Example 6 | 23 |
| Example 7 | 26 |
| Comparative Example 1 | 15 |
| Comparative Example 2 | 20 |
| Comparative Example 3 | 9 |

As is clear from Table 6, the surface-coated cutting tools in Examples each have the rake face excellent in resistance to plastic deformation, and hence are better in resistance to wear and longer in life of the tool than the surface-coated cutting tools in Comparative Examples. Namely, it could be confirmed that mechanical characteristics of the coating in the surface-coated cutting tools in Examples were improved.

<Cutting Test 2>

For the surface-coated cutting tools in Examples and Comparative Examples shown in Table 7 below, under cutting conditions below, a time period of cutting until an amount of crater wear (Kt) reached 0.20 mm was counted and a final form of damage of a cutting edge was observed. Table 7 shows results. A longer time period of cutting indicates better resistance to wear and longer life of the tool.

<Conditions for Cutting>

Work material: Cutting of outer circumference of round rod of SKD
Peripheral speed: 100 m/min.
Feed rate: 0.5 mm/rev
Cutting depth: 2.0 mm
Coolant: used

TABLE 7

| | Time Period of Cutting (Minute) |
|---|---|
| Example 8 | 15 |
| Example 9 | 11 |
| Example 10 | 20 |
| Example 11 | 15 |
| Example 12 | 18 |
| Example 13 | 17 |
| Example 14 | 12 |
| Example 15 | 10 |
| Comparative Example 4 | 6 |
| Comparative Example 5 | 9 |
| Comparative Example 6 | 4 |

As is clear from Table 7, the surface-coated cutting tools in Examples each have the rake face excellent in resistance to plastic deformation, and hence are better in resistance to wear and longer in life of the tool than the surface-coated cutting tools in Comparative Examples. Namely, it could be confirmed that mechanical characteristics of the coating in the surface-coated cutting tools in Examples were improved.

<Cutting Test 3>

For the surface-coated cutting tools in Examples and Comparative Examples shown in Table 8 below, under cutting conditions below, a time period of cutting until an amount of wear of the flank face (Vb) reached 0.20 mm was counted and a final form of damage of a cutting edge was observed. Table 8 shows results. A longer time period of cutting indicates better resistance to wear and longer life of the tool. The final form of damage shown as wear indicates good resistance to chipping and similarly longer life of the tool.

<Conditions for Cutting>

Work material: Infeed cutting of round rod of SCM440

Peripheral speed: 250 m/min.

Feed rate: 0.45 mm/rev

Cutting depth: 2.0 mm

Coolant: used

TABLE 8

|  | Time Period of Cutting (Minute) | Final Form of Damage |
| --- | --- | --- |
| Example 8 | 18 | Wear |
| Example 9 | 20 | Wear |
| Example 10 | 25 | Wear |
| Example 11 | 17 | Wear |
| Example 12 | 23 | Wear |
| Example 13 | 21 | Wear |
| Example 14 | 15 | Wear |
| Example 15 | 15 | Wear |
| Comparative Example 4 | 5 | Breakage |
| Comparative Example 5 | 8 | Chipping |
| Comparative Example 6 | 3 | Breakage |

As is clear from Table 8, the surface-coated cutting tools in Examples are better in both of resistance to wear and resistance to chipping and longer in life of the tool than the surface-coated cutting tools in Comparative Examples. Namely, it could be confirmed that mechanical characteristics of the coating in the surface-coated cutting tools in Examples were improved.

<Cutting Test 4>

For the surface-coated cutting tools in Examples and Comparative Examples shown in Table 9 below, a time period of cutting until the tool is broken under cutting conditions below was counted. Table 9 shows results. A longer time period of cutting indicates better resistance to breakage and longer life of the tool.

<Conditions for Cutting>

Work material: SKD5 (infeed cutting of 90°×4 grooves)

Peripheral speed: 100 m/min.

Feed rate: 0.4 mm/rev

Cutting depth: 2.0 mm

Coolant: used

TABLE 9

|  | Time Period of Cutting (Minute) |
| --- | --- |
| Example 1 | 3.0 |
| Example 2 | 3.5 |
| Example 6 | 2.0 |
| Example 7 | 3.4 |
| Comparative Example 1 | 1.3 |
| Comparative Example 2 | 1.5 |
| Comparative Example 3 | 0.5 |
| Example 9 | 4.1 |
| Example 10 | 4.8 |
| Example 12 | 2.7 |
| Example 15 | 4.6 |
| Comparative Example 4 | 1.8 |
| Comparative Example 5 | 2.1 |
| Comparative Example 6 | 0.7 |

As is clear from Table 9, the surface-coated cutting tools in Examples are better in resistance to breakage and longer in life of the tool than the surface-coated cutting tools in Comparative Examples. Namely, it could be confirmed that mechanical characteristics of the coating in the surface-coated cutting tools in Examples were improved.

<Confirmation of Effect of Surface Roughness Ra of α-Al$_2$O$_3$ Layer>

Surface roughness Ra of the α-Al$_2$O$_3$ layer in the surface-coated cutting tools in Examples 1, 2, and 11 was measured under JIS B 0601 (2001). Table 10 shows results.

Then, surface-coated cutting tools in Examples 1A, 2A, and 11A were fabricated by subjecting the α-Al$_2$O$_3$ layer of each surface-coated cutting tool to aerolap treatment under conditions below. Surface roughness Ra of the α-Al$_2$O$_3$ layer in the surface-coated cutting tool was measured similarly to the above. Table 10 shows results.

<Conditions for Aerolap Treatment>

Media: elastic rubber media with a diameter of approximately 1 mm, which contain diamond grains having an average grain size of 0.1 μm (a trademark: "MultiCone" manufactured by Yamashita Works Co., Ltd.).

Projection pressure: 0.5 bar

Time period of projection: 30 seconds

Wet/dry: dry

For the surface-coated cutting tools in Examples 1, 1A, 2, 2A, 11, and 11A, a time period of cutting until an amount of wear of the flank face (Vb) reached 0.20 mm under cutting conditions below was counted. Table 10 shows results. A longer time period of cutting indicates stable capability to discharge chips, with a coefficient of friction between chips and the cutting edge of the tool being lower.

<Conditions for Cutting>

Work material: Cutting of outer circumference of round rod of SS400

Peripheral speed: 100 m/min.

Feed rate: 0.55 mm/rev

Cutting depth: 1.0 mm

Coolant: not used

TABLE 10

|  | Surface Roughness Ra (μm) | Time Period of Cutting (Minute) |
| --- | --- | --- |
| Example 1 | 0.33 | 27 |
| Example 1A | 0.12 | 40 |
| Example 2 | 0.30 | 30 |

TABLE 10-continued

| | Surface Roughness Ra (μm) | Time Period of Cutting (Minute) |
|---|---|---|
| Example 2A | 0.10 | 53 |
| Example 11 | 0.28 | 35 |
| Example 11A | 0.10 | 60 |

As is clear from Table 10, it could be confirmed that the surface-coated cutting tools in Examples 1A, 2A, and 11A including the α-Al$_2$O$_3$ layer having surface roughness Ra less than 0.2 μm could achieve lowering in coefficient of friction between chips and the cutting edge of the tool and exhibited stable capability to discharge chips, as compared with the surface-coated cutting tools in Examples 1, 2, and 11 including the α-Al$_2$O$_3$ layer having surface roughness Ra equal to or more than 0.2 μm.

<Confirmation of Effect of Compressive Stress Provided to α-Al$_2$O$_3$ Layer>

For the surface-coated cutting tools in Examples 1, 2, and 11, it was confirmed that there was a point where an absolute value for stress was maximal, in a region within 2 μm from the surface side of the coating in the α-Al$_2$O$_3$ layer, and the absolute value of stress at that point was measured. Table 11 shows results (in a field of "stress value"). Stress was measured with the sin$^2$ψ method using X-rays, and a numeric value in the field of "stress value" in Table 11 shows an absolute value, with tensile stress being denoted as "tensile" and compressive stress being denoted as "compressive".

Then, surface-coated cutting tools in Examples 1B, 1C, 2B, 2C, and 11B were fabricated by subjecting the α-Al$_2$O$_3$ layer of each surface-coated cutting tool to wet blast treatment under conditions below. Then, for each surface-coated cutting tool, similarly to the above, it was confirmed that there was a point where an absolute value of stress was maximal, in a region within 2 μm from the surface side of the coating in the α-Al$_2$O$_3$ layer, and the absolute value of stress at that point was measured. Table 11 shows results (in a field of "stress value"). Difference in stress between Example 1B and Example 1C and between Example 2B and Example 2C is attributed to a difference in projection pressure in wet blast treatment.

<Conditions for Wet Blast Treatment>
Media: alumina media (φ50 μm)
Projection pressure: 1 to 2 bars
Time period of projection: 10 seconds
Wet/dry: Wet A time period of cutting until the tool is broken under conditions for cutting below was counted for the surface-coated cutting tools in Examples 1, 1B, 1C, 2, 2B, 2C, 11, and 11B. Table 11 shows results. A longer time period of cutting indicates suppression of breakage of the cutting edge of the tool due to mechanical and thermal fatigue which occurs during an intermittent cutting process and resultant improvement in reliability of the cutting edge.

<Conditions for Cutting>
Work material: SUS304 (cutting of outer circumference of 60°×3 grooves)
Peripheral speed: 80 m/min.
Feed rate: 0.50 mm/rev
Cutting depth: 1.0 mm
Coolant: not used

TABLE 11

| | Stress Value (GPa) | Time Period of Cutting (Minute) |
|---|---|---|
| Example 1 | 0.7 (Tensile) | 12 |
| Example 1B | 0.8 (Compressive) | 22 |
| Example 1C | 1.0 (Compressive) | 20 |
| Example 2 | 0.8 (Tensile) | 10 |
| Example 2B | 0.6 (Compressive) | 20 |
| Example 2C | 0.2 (Compressive) | 14 |
| Example 11 | 0.6 (Tensile) | 15 |
| Example 11B | 0.8 (Compressive) | 27 |

As is clear from Table 11, it could be confirmed that a point where the absolute value of stress was maximal was included in the region within 2 μm from the surface side of the coating in the α-Al$_2$O$_3$ layer, breakage of the cutting edge of the tool due to mechanical and thermal fatigue which occurred during an intermittent cutting process was suppressed in a case that stress at that point was compressive stress of which absolute value was smaller than 1 GPa as compared with a case that stress at that point was tensile stress, and consequently reliability of the cutting edge improved.

Though the embodiment and the examples of the present invention have been described above, combination of features in each embodiment and example described above as appropriate and various modifications thereof are also originally intended.

It should be understood that the embodiment disclosed herein is illustrative and non-restrictive in every respect. The scope of the present invention is defined by the terms of the claims, rather than the embodiment above, and is intended to include any modifications within the scope and meaning equivalent to the terms of the claims.

REFERENCE SIGNS LIST 1 rake face; 2 flank face; 3 cutting edge ridgeline portion; 10 tool; 11 base material; 11a rake face; 11b flank face; 11c cutting edge ridgeline portion; and 12 coating.

The invention claimed is:

1. A surface-coated cutting tool having a rake face and a flank face, comprising:
a base material; and
a coating formed on the base material,
the coating including an α-Al$_2$O$_3$ layer,
the α-Al$_2$O$_3$ layer containing a plurality of crystal grains of α-Al$_2$O$_3$,
a grain boundary of the crystal grains including a CSL grain boundary and a general grain boundary,
the α-Al$_2$O$_3$ layer on a rake face side showing (001) orientation,
in the α-Al$_2$O$_3$ layer on the rake face side, a length L$_{R3}$ of a Σ3 crystal grain boundary in the CSL grain boundary exceeding 80% of a length L$_{R3-29}$ of a Σ3-29 crystal grain boundary and being not lower than 10% and not higher than 50% of a total length L$_R$ of all grain boundaries which is a sum of the length L$_{R3-29}$ and a length L$_{RG}$ of the general grain boundary,
the α-Al$_2$O$_3$ layer on a flank face side showing (001) orientation,
in the α-Al$_2$O$_3$ layer on the flank face side, a length L$_{F3}$ of a Σ3 crystal grain boundary in the CSL grain boundary exceeding 80% of a length L$_{F3-29}$ of a Σ3-29 crystal grain boundary and being not lower than 10% and not higher than 50% of a total length L$_F$ of all grain boundaries which is a sum of the length $L_{F3\text{-}29}$ and a length $L_{FG}$ of the general grain boundary, and a ratio $L_{R3}/L_{R3\text{-}29}$ of the length $L_{R3}$ to the length $L_{R3\text{-}29}$ being higher than a ratio $L_{F3}/L_{F3\text{-}29}$ of the length $L_{F3}$ to the length $L_{F3\text{-}29}$, and the (001) orientation being defined as such a condition that a ration of the crystal grains of $\alpha\text{-Al}_2\text{O}_3$ of which normal direction to a (001) planes is within ±20° with respect to a normal direction to a surface of the $\alpha\text{-Al}_2\text{O}_3$ layer is not lower than 50% in the $\alpha\text{-Al}_2\text{O}_3$ layer.

2. The surface-coated cutting tool according to claim 1, wherein the CSL grain boundary is constituted of the Σ3 crystal grain boundary, a Σ7 crystal grain boundary, a Σ11 crystal grain boundary, a Σ17 crystal grain boundary, a Σ19 crystal grain boundary, a Σ21 crystal grain boundary, a Σ23 crystal grain boundary, and a Σ29 crystal grain boundary, the length $L_{R3\text{-}29}$ is a total sum of lengths of the Σ3 crystal grain boundary, the Σ7 crystal grain boundary, the Σ11 crystal grain boundary, the Σ17 crystal grain boundary, the Σ19 crystal grain boundary, the Σ21 crystal grain boundary, the Σ23 crystal grain boundary, and the Σ29 crystal grain boundary in the $\alpha\text{-Al}_2\text{O}_3$ layer on the rake face side, and the length $L_{F3\text{-}29}$ is a total sum of lengths of the Σ3 crystal grain boundary, the Σ7 crystal grain boundary, the Σ11 crystal grain boundary, the Σ17 crystal grain boundary, the Σ19 crystal grain boundary, the Σ21 crystal grain boundary, the Σ23 crystal grain boundary, and the Σ29 crystal grain boundary in the $\alpha\text{-Al}_2\text{O}_3$ layer on the flank face side.

3. The surface-coated cutting tool according to claim 1, wherein the $\alpha\text{-Al}_2\text{O}_3$ layer has a thickness from 2 to 20 μm.

4. The surface-coated cutting tool according to claim 1, wherein the $\alpha\text{-Al}_2\text{O}_3$ layer has surface roughness Ra less than 0.2 μm.

5. The surface-coated cutting tool according to claim 1, wherein the $\alpha\text{-Al}_2\text{O}_3$ layer includes a point where an absolute value for compressive stress is maximal, in a region within 2 μm from a surface side of the coating, and the absolute value for compressive stress at the point is lower than 1 GPa.

6. The surface-coated cutting tool according to claim 1, wherein the coating includes a TiCxNy layer between the base material and the $\alpha\text{-Al}_2\text{O}_3$ layer, and the TiCxNy layer contains TiCxNy satisfying atomic ratio relation of $0.6 \leq x/(x+y) \leq 0.8$.

7. The surface-coated cutting tool according to claim 1, wherein the length $L_{R3}$ and the length $L_{F3}$ of the Σ3 crystal grain boundary are obtained from a cross-section formed when the $\alpha\text{-Al}_2\text{O}_3$ layer is cut along a plane including the normal line to a surface of the $\alpha\text{-Al}_2\text{O}_3$ layer.

* * * * *